(12) United States Patent
Ohba

(10) Patent No.: US 10,998,123 B2
(45) Date of Patent: May 4, 2021

(54) BALUN AND METHOD FOR MANUFACTURING SAME

(71) Applicant: Murata Manufacturing Co., Ltd., Kyoto-fu (JP)

(72) Inventor: Yuichi Ohba, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 374 days.

(21) Appl. No.: 16/175,575

(22) Filed: Oct. 30, 2018

(65) Prior Publication Data

US 2019/0172628 A1 Jun. 6, 2019

(30) Foreign Application Priority Data

Dec. 5, 2017 (JP) .............................. JP2017-233711

(51) Int. Cl.
*H01F 27/28* (2006.01)
*H03H 7/42* (2006.01)
(Continued)

(52) U.S. Cl.
CPC ......... *H01F 27/2823* (2013.01); *H01F 19/04* (2013.01); *H01F 27/24* (2013.01);
(Continued)

(58) Field of Classification Search
USPC ........................................ 336/170, 175, 213
See application file for complete search history.

(56) References Cited

U.S. PATENT DOCUMENTS 3,500,252 A * 3/1970 Wakker .................... H03H 7/38
333/131
3,766,499 A * 10/1973 Dillenberger .......... H03H 7/482
333/112
(Continued)

FOREIGN PATENT DOCUMENTS

CN 101258567 A 9/2008
JP S61295610 A 12/1986
(Continued)

OTHER PUBLICATIONS

An Office Action issued by the China National Intellectual Property Administration dated Oct. 9, 2020, which corresponds to Chinese Patent Application No. 201811182644.1 and is related to U.S. Appl. No. 16/175,575 with English language translation.
(Continued)

*Primary Examiner* — Ronald Hinson
(74) *Attorney, Agent, or Firm* — Studebaker & Brackett PC

(57) ABSTRACT

A balun includes a core having a plurality of through holes and a plurality of conductors wound around a portion between two through holes in the core and constituting first and second coils. The conductors include parallel lines in which a first conductor, a second conductor, and a third conductor are arranged in substantially parallel in this order and are integrated so as to include planar sections. The first and second coils include a continuous portion of first, second, and third winding portions. The first winding portion is formed of the wound second conductor. The second winding portion is formed of the parallel lines wound such that the planar sections cover the first winding portion. The third winding portion is formed of the second conductor wound on the second winding portion. The first coil includes
(Continued)

a center tap connected to end portions of the first and third conductors.

19 Claims, 5 Drawing Sheets

(51) Int. Cl.
*H01F 27/24* (2006.01)
*H01F 41/10* (2006.01)
*H01F 41/02* (2006.01)
*H01F 41/064* (2016.01)
*H01F 27/29* (2006.01)
*H01F 41/08* (2006.01)
*H01F 19/04* (2006.01)

(52) U.S. Cl.
CPC ......... *H01F 27/29* (2013.01); *H01F 41/0206* (2013.01); *H01F 41/064* (2016.01); *H01F 41/08* (2013.01); *H01F 41/10* (2013.01); *H03H 7/42* (2013.01)

(56) References Cited

U.S. PATENT DOCUMENTS

| | | | | |
|---|---|---|---|---|
| 4,173,742 A * | 11/1979 | Lehmann | ................ | H01Q 1/00 333/100 |
| 5,619,172 A * | 4/1997 | Reynolds | ................ | H03H 7/42 333/25 |
| 5,705,961 A * | 1/1998 | Yee | ................ | H01F 17/06 333/131 |
| 6,111,465 A * | 8/2000 | Kakuta | ................ | H01F 19/04 330/276 |
| 6,114,924 A * | 9/2000 | Cain | ................ | H03H 7/482 333/112 |
| 6,239,668 B1 * | 5/2001 | Menna | ................ | H03H 7/42 333/25 |
| 6,806,790 B2 * | 10/2004 | Ji | ................ | H03H 7/48 333/119 |
| 7,612,641 B2 * | 11/2009 | Jean | ................ | H01F 27/292 336/192 |
| 7,705,703 B2 * | 4/2010 | Tsao | ................ | H01F 17/062 336/192 |
| 7,839,254 B2 * | 11/2010 | Dinsmore | ................ | H01F 19/08 336/212 |
| 10,504,647 B2 * | 12/2019 | Renteria | ................ | H01F 27/29 |
| 2002/0048159 A1 * | 4/2002 | Tsao | ................ | H05K 1/141 361/807 |
| 2005/0052331 A1 * | 3/2005 | Rauch | ................ | H01Q 9/16 343/821 |
| 2006/0006963 A1 * | 1/2006 | Ji | ................ | H01F 17/062 333/181 |
| 2008/0186121 A1 | 8/2008 | Kawahata et al. | | |
| 2009/0265918 A1 * | 10/2009 | Dounaevsky | ................ | H01F 17/06 29/606 |
| 2017/0033762 A1 * | 2/2017 | O'Toole | ................ | H03H 3/013 |

FOREIGN PATENT DOCUMENTS

| | | |
|---|---|---|
| JP | H02110310 U | 9/1990 |
| JP | H02280507 A | 11/1990 |
| JP | 2002-246233 A | 8/2002 |
| JP | 2014-203989 A | 10/2014 |
| WO | 2007-029594 A1 | 3/2007 |

OTHER PUBLICATIONS

An Office Action; "Notification of Reasons for Refusal," issued by the Japanese Patent Office dated Jan. 28, 2020, which corresponds to Japanese Patent Application No. 2017-233711 and is related to U.S. Appl. No. 16/175,575; with English language translation.

* cited by examiner

BALUN AND METHOD FOR MANUFACTURING SAME

CROSS-REFERENCE TO RELATED APPLICATION

This application claims benefit of priority to Japanese Patent Application No. 2017-233711, filed Dec. 5, 2017, the entire content of which is incorporated herein by reference.

BACKGROUND

Technical Field

The present disclosure relates to a balance-to-unbalance transformer (balun) and a method for manufacturing the same.

Background Art

A balun is used for transformation from a single end mode signal to a differential mode signal between a coaxial cable and an electronic circuit in a set-top box or the like. A common example used as a balun that can support a wide range from low frequencies to high frequencies is the type including a core having a plurality of through holes and having wires wound on the core. The core has an oval cross section and a cylindrical shape, and the through holes are two parallel through holes perpendicular to the cross section.

Japanese Unexamined Patent Application Publication No. 2002-246233 discloses a branch transformer including a core having two through holes, a main signal wire, a main grounding wire, a branch signal wire, and a branch grounding wire. The main signal wire and main grounding wire are wound around a main winding portion. The branch signal wire and the branch grounding wire are wound around a branch winding portion, and the main signal wire is extended and wound around the branch winding portion. A ground end of the main grounding wire and a ground end of the branch grounding wire are twisted together. An output end of the main signal wire and a non-ground end of the branch grounding wire are twisted together. A non-branch end of the branch signal wire and a non-ground end of the main grounding wire are twisted together. This branch transformer can maintain stable coupling throughout the used frequencies.

A balun may use a twisted wire in which a plurality of conductors are twisted, or parallel lines in which a plurality of conductors arranged in parallel are fused. In general, the twisted wire has strong coupling between the conductors and is effective in improving the characteristics in a high frequency range. In the case of the twisted wire, however, because it is necessary to untie the twist in binding each of the conductors to terminals, a complicated manufacturing process is a problem. In the case of the parallel lines, which do not need untying the twist, it may be difficult to achieve sufficient high-frequency characteristics.

SUMMARY

Accordingly, the present disclosure provides a balun in which an insertion loss in a high frequency range is reduced and a method for manufacturing the same.

According to preferred embodiments of the present disclosure, a balun includes a core having a plurality of through holes and a plurality of conductors wound around a portion between two through holes in the core and constituting a first coil and a second coil. The plurality of conductors include parallel lines in which a first conductor, a second conductor, and a third conductor are arranged in substantially parallel in this order and are integrated so as to include planar sections. The first coil and the second coil include a continuous portion of a first winding portion, a second winding portion, and a third winding portion. The first winding portion is formed of the wound second conductor. The second winding portion is formed of the parallel lines wound such that the planar sections cover the first winding portion. The third winding portion is formed of the second conductor wound on the second winding portion. The first coil includes a center tap connected to an end portion on an ending side of winding of the first conductor and an end portion on a beginning side of winding of the third conductor. An end portion on a beginning side of winding of the first conductor and an end portion on an ending side of winding of the third conductor are opposite end portions of the first coil. Opposite end portions of the second conductor are opposite end portions of the second coil.

According to preferred embodiments of the present disclosure, a method for manufacturing a balun including a core, a first coil including a center tap, and a second coil includes preparing the core having at least two through holes, preparing parallel lines in which a first conductor, a second conductor, and a third conductor are arranged in substantially parallel in this order and are integrated so as to include planar sections, and forming a first winding portion by winding the second conductor separated from the parallel lines around a portion between the two through holes in the core. The method also includes subsequently forming a second winding portion by winding the parallel lines while covering the first winding portion with the planar sections in the parallel lines, and subsequently forming a third winding portion by winding the second conductor separated from the parallel lines on the second winding portion. The method further includes connecting an end portion on an ending side of winding of the first conductor and an end portion on a beginning side of winding of the third conductor to a center-tap terminal in the first coil, connecting an end portion on a beginning side of winding of the first conductor and an end portion on an ending side of winding of the third conductor to terminals on opposite end portions in the first coil, respectively, and connecting opposite end portions of the second conductor to terminals on opposite end portions in the second coil, respectively.

The present disclosure can provide a balun in which an insertion loss in a high-frequency range is reduced and a method for manufacturing the same.

Other features, elements, characteristics and advantages of the present disclosure will become more apparent from the following detailed description of preferred embodiments of the present disclosure with reference to the attached drawings.

DETAILED DESCRIPTION

Figure 1:
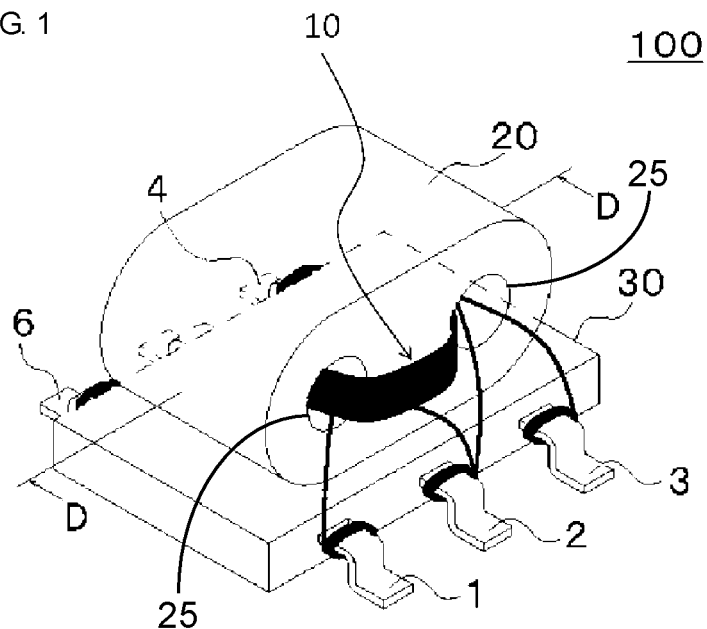
FIG. 1 is a partially transparent perspective view of a balun according to a first embodiment.

A balun includes a core having a plurality of through holes and a plurality of conductors wound around a portion between two through holes in the core and constituting a first coil and a second coil. The plurality of conductors include parallel lines in which a first conductor, a second conductor, and a third conductor are arranged in substantially parallel in this order and are integrated so as to include planar sections. The first coil and the second coil include a continuous portion of a first winding portion, a second winding portion, and a third winding portion. The first winding portion is formed of the wound second conductor. The second winding portion is formed of the parallel lines wound such that the planar sections cover the first winding portion. The third winding portion is formed of the second conductor wound on the second winding portion. The first coil includes a center tap connected to an end portion on an ending side of winding of the first conductor and an end portion on a beginning side of winding of the third conductor. An end portion on a beginning side of winding of the first conductor and an end portion on an ending side of winding of the third conductor are opposite end portions of the first coil. Opposite end portions of the second conductor are opposite end portions of the second coil.

In the above-described balun, the second conductor constituting the second coil in the parallel lines is sandwiched between the first conductor and third conductor constituting the first coil. The first winding portion and third winding portion formed of the second conductor sandwich the second winding portion including the first conductor and third conductor. In the balun including the conductors wound described above, the coupling between the first coil and second coil is enhanced, and in particular, the insertion loss in a high-frequency range can be reduced. Because the conductors are wound by separating part of the parallel lines, unlike twisted wires, time and effort for untying twists are not required, complication of the manufacturing process can be avoided.

Each of the two through holes in the core may have an arc area in a cross section substantially perpendicular to its penetrating direction, and the two through holes may be arranged such that their arc areas face each other with the core disposed therebetween. When the conductors are wound around the arc areas, collapse of winding of the conductors can be effectively suppressed.

Each of the two through holes in the core may have a linear area in a cross section substantially perpendicular to its penetrating direction, and the two through holes may be arranged such that their linear areas arranged in substantially parallel face each other with the core disposed therebetween. When the conductors are wound around the planar areas, collapse of winding of the conductors can be effectively suppressed.

The through holes in the core may have recesses for housing the first winding portion. When the first winding portion is housed in the recesses, collapse of winding of the second winding portion can be more effectively suppressed.

The second winding portion may be formed of the parallel lines passing through at least one of the through holes at least twice, and at least two planar sections in the parallel lines may be arranged in substantially the same plane. When the parallel lines in the second winding portion are wound alongside, the coupling between the first coil and second coil can be more enhanced, and the insertion loss in a high-frequency range can be more reduced.

The balun may further include a base on which the core is placed. The base may include a first terminal portion including at least three terminals connected to the opposite end portions and the center tap in the first coil, respectively, and a second terminal portion including at least two terminals connected to the opposite end portions in the second coil, respectively. When the balun includes the base including the terminal portions, the mountability can be improved.

The first terminal portion and the second terminal portion may be arranged on opposed side surfaces of the base. With this configuration, the mountability can be more improved.

A method for manufacturing a balun including a core, a first coil including a center tap, and a second coil includes preparing the core having at least two through holes; and preparing parallel lines in which a first conductor, a second conductor, and a third conductor are arranged substantially parallel in this order and are integrated so as to include planar sections. The method also includes forming a first winding portion by winding the second conductor separated from the parallel lines around a portion between the two through holes in the core; subsequently forming a second winding portion by winding the parallel lines while covering the first winding portion with the planar sections in the parallel lines; and subsequently forming a third winding portion by winding the second conductor separated from the parallel lines on the second winding portion. The method further includes connecting an end portion on an ending side of winding of the first conductor and an end portion on a beginning side of winding of the third conductor to a center-tap terminal in the first coil; connecting an end portion on a beginning side of winding of the first conductor and an end portion on an ending side of winding of the third conductor to terminals on opposite end portions in the first coil, respectively; and connecting opposite end portions of the second conductor to terminals on opposite end portions in the second coil, respectively. Because the conductors are wounded by separating part of the parallel lines, unlike twisted wires, time and effort for untying twists are not required, complication of the manufacturing process can be avoided.

Embodiments of the present disclosure are described below with reference to the drawings. The embodiments described below exemplify a balun and a method for manufacturing the same for embodying a technical idea of the present disclosure, and the present disclosure is not limited to the balun and the method for manufacturing the same described below. The members indicated in the claims are never limited to members in the embodiments. In particular, the dimensions, materials, shapes, relative arrangements, and the like of components described in the embodiments are not intended to limit the scope of the present disclosure thereto unless otherwise specified, and they are merely examples for description. The sizes, positional relationships, and the like of the members illustrated in the drawings may be exaggerated to clarify the explanation. In the description below, the same names and numerals indicate the same or similar members, and detailed description on them is omitted as appropriate. As for the elements in the present disclosure, a single member may serve as a plurality of elements by making the plurality of elements of the same member, and conversely, a plurality of members may share a function of a single member. The content described in an embodiment may apply to other embodiments.

First Embodiment

Figure 2:
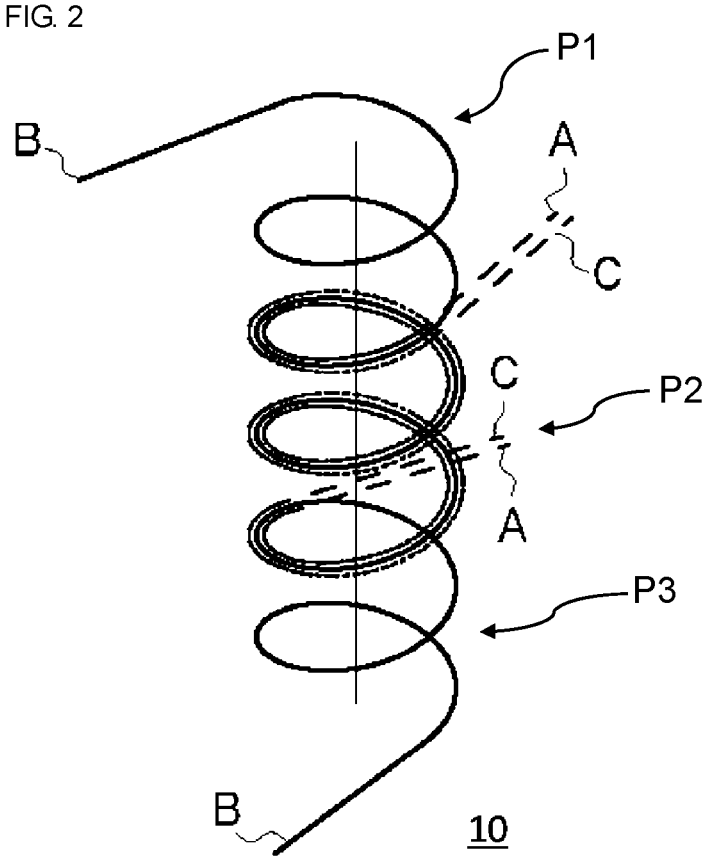
FIG. 2 is a conceptual diagram for describing a winding state of the balun according to the first embodiment.
Figure 3:
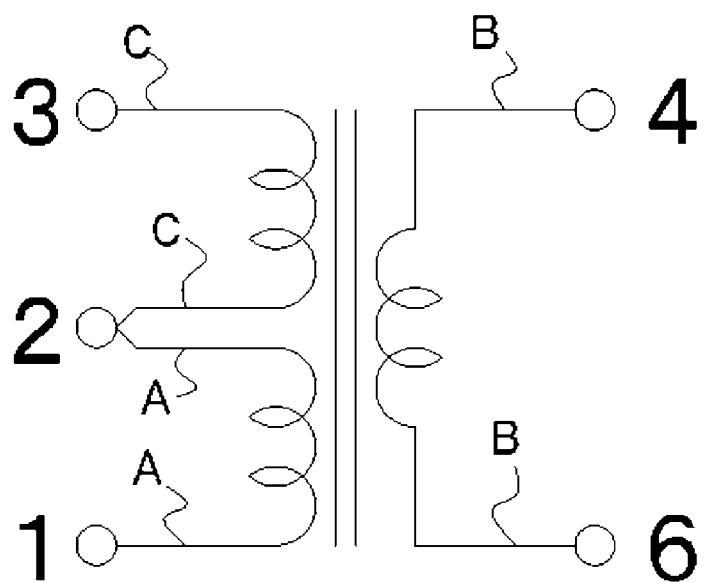
FIG. 3 is an equivalent circuit diagram of the balun according to the first embodiment.
Figure 4:
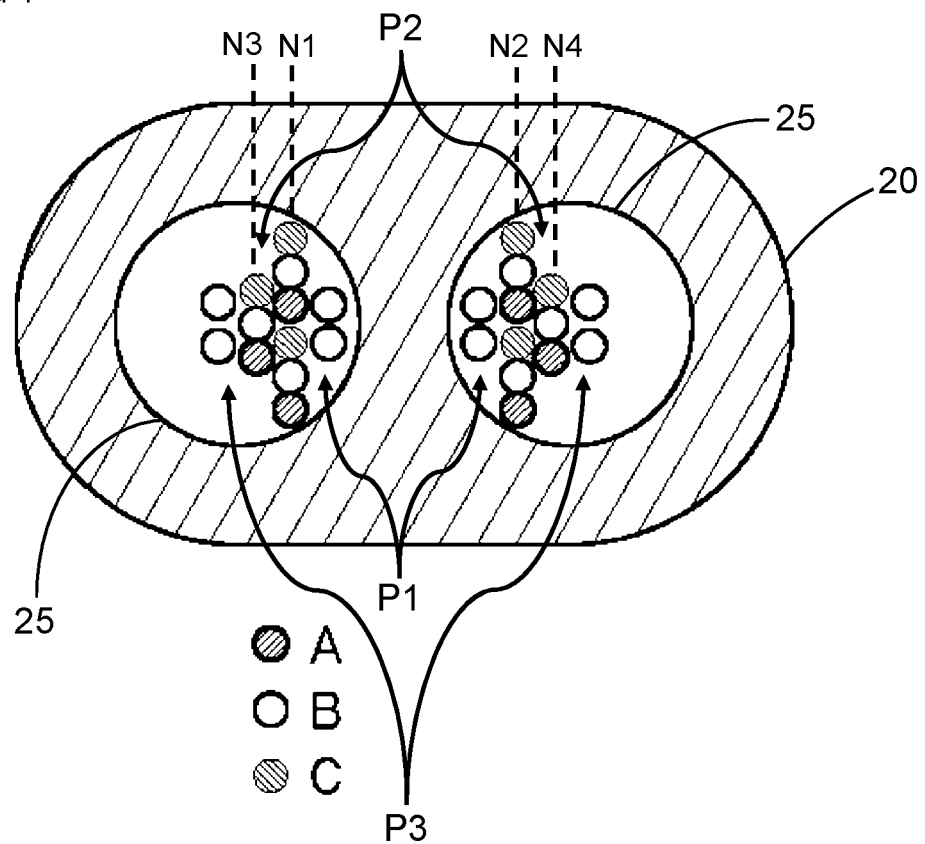
FIG. 4 is a schematic cross-sectional view for describing the winding state of the balun according to the first embodiment.
Figure 5:
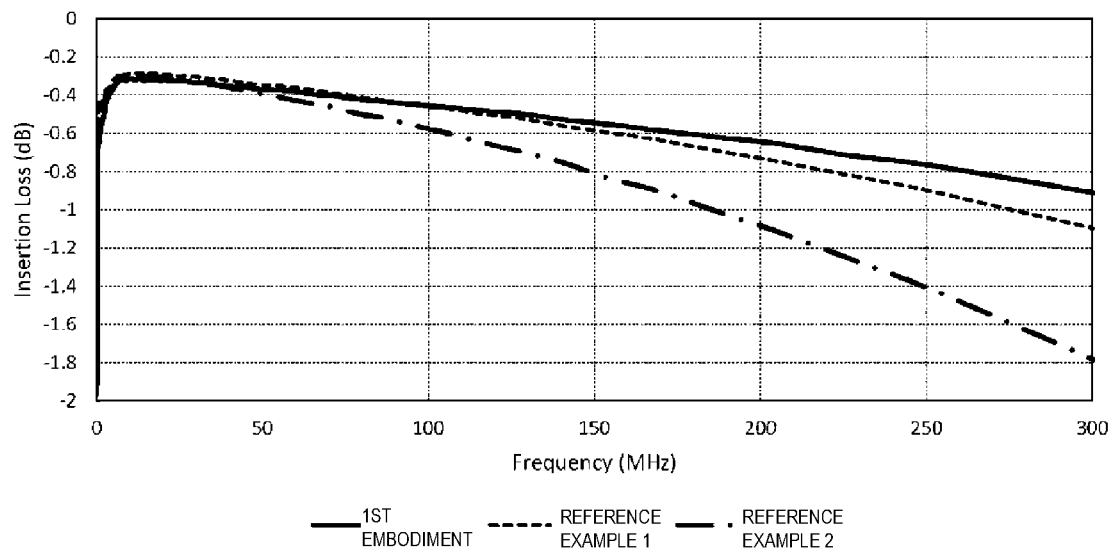
FIG. 5 illustrates insertion-loss characteristics of the balun according to the first embodiment.

A balun according to a first embodiment is described below with reference to FIGS. 1 to 5. FIG. 1 is a partially transparent perspective view of the balun. FIG. 2 is a conceptual diagram for describing a winding state of a coil. FIG. 3 is an equivalent circuit diagram of the balun. FIG. 4 is a cross-sectional view for describing the winding state of the coil. FIG. 5 illustrates insertion-loss characteristics of the balun.

As illustrated in FIG. 1, a balun 100 includes a core 20 having two through holes 25, a plurality of conductors 10 wound around the portion between the two through holes 25, and a base 30 on which the core 20 is placed. The two through holes 25 in the core are arranged such that their penetrating directions are substantially parallel to each other. Each of the through holes 25 has an approximately circular shape in a cross section substantially perpendicular to the penetrating direction. In the core, the portion between the two through holes 25 has arc-shaped curved areas. One example of the core 20 may be made of a ferrite material, such as a nickel zinc material or a manganese zinc material. The size of the through hole 25 can be selected in accordance with a wound conductor or the like. One example size of the through hole 25 may be one allowing the parallel lines of the conductors to be wound such that their planar sections are arranged on substantially the same plane.

The plurality of conductors 10 are wound around the portion between the two through holes 25 and constitute a first coil and a second coil. The plurality of conductors 10 alternately extend through the two through holes 25 in opposite directions, are wound around the portion between the through holes 25, and constitute the first coil having two tips (end portions) and a center tap, and the second coil having two tips (end portions). Here, the passage of the conductor through a single through hole is referred to as 0.5 turns, and the alternate passage of the conductor through the two through holes 25 in opposite directions is referred to as 1 turn. The plurality of conductors 10 include parallel lines in which a first conductor A, a second conductor B, and a third conductor C (FIGS. 2 and 4) are arranged substantially parallel in this order, and are integrated so as to include planar sections substantially parallel with the extending direction, and the arranging direction of the conductors are integrated. Each of the first conductor A, second conductor B, and third conductor C is a conductive wire with insulating coating of thermoplastic resin, such as polyurethane. The three conductors A, B and C are arranged substantially parallel with each other and fused with an adhesive layer formed on the outer region of the insulating coating interposed therebetween. In this way, the parallel lines are formed.

The base 30 is made of thermosetting resin, such as diallyl phthalate, and includes a first terminal portion and a second terminal portion on opposed side surfaces thereof. The first terminal portion includes three terminals 1 to 3. The second terminal portion includes at least a terminal 4 and a terminal 6. The terminal 1 in the first terminal portion is connected to a first tip of the first coil. The terminal 2 is connected to the center tap in the first coil. The terminal 3 is connected to a second tip of the first coil. The terminals 4 and 6 in the second terminal portion are connected to the tips of the second coil, respectively. Each of the terminals 1, 2, 3, 4, and 6 is formed by application of tin plating and nickel plating on a metal, such as copper.

FIG. 2 is a conceptual diagram that schematically illustrates a winding state of the conductors 10 in the first embodiment. FIG. 3 is an equivalent circuit diagram of the balun. The conductors 10 includes a continuous portion having a portion (first winding portion P1) in which a second conductor B is separated from the parallel lines, a parallel-line portion (second winding portion P2) in which a first conductor A, the second conductor B, and a third conductor C are arranged in substantially parallel in this order and are integrated, and a portion (third winding portion P3) in which the second conductor B is separated from the parallel lines. In FIG. 2, the second conductor B sandwiched between the first conductor A and third conductor C in the parallel lines is separated from the parallel lines, and is wound about 1.5 turns between the two through holes 25 in the core, to form the first winding portion P1. Subsequently, the parallel lines, in which the first conductor A, second conductor B, and third conductor C are integrated, are wound about 3 turns on the first winding portion P1, to form the second winding portion P2. At this time, the parallel lines are wound such that the planar sections N1, N2, N3 and N4 are opposed to the first winding portion P1. That is, the second winding portion P2 is formed of the parallel lines covering the first winding portion P1 with the parallel sections. Subsequently, the second conductor B is separated from the parallel lines, and is wound about 1.5 turns on the second winding portion, to form the third winding portion P3.

As illustrated in FIG. 3, the tip on the beginning side of winding of the first conductor A separated from the parallel lines in forming the first winding portion P1 is connected to the terminal 1 as a first tip of the first coil. The tip on the beginning side of winding of the third conductor C separated at the same time is connected to the terminal 2 as a first one of conductors constituting the center tap in the first coil. The tip on the ending side of winding of the first conductor A separated from the parallel lines in forming the third winding portion P3 is connected to the terminal 2 as a second one of the conductors constituting the center tap in the first coil. The tip on the ending side of winding of the third conductor C separated at the same time is connected to the terminal 3 as a second tip of the first coil. The tip on the beginning side of winding of the second conductor B is connected to the terminal 6 as a first tip of the second coil. The tip on the ending side of winding of the second conductor B is connected to the terminal 4 as a second tip of the second coil. Connection of the conductor to the terminal can be made by solder dipping, laser welding, or the like. By this method, the insulating coating can be removed, and the conductors can be electrically coupled to the terminals.

In the balun 100, the second conductor B constituting the second coil is wound a predetermined number of turns and forms the first winding portion. Subsequently, the parallel lines in which the first conductor A, second conductor B, and third conductor C are arranged in substantially parallel and integrated are wound twice the predetermined number of turns and form the second winding portion P2. Subsequently, the second conductor B is wound the predetermined number of turns again and forms the third winding portion P3. In this way, the balun 100 in which the first coil and the second coil have the same number of turns, that is, the impedance ratio is 1:1 is configured.

FIG. 4 is a schematic cross-sectional view that illustrates an example of arrangement of conductors in a cross section of the core 20 substantially perpendicular to the penetrating directions of the two through holes 25. FIG. 4 is a cross-sectional view of the core 20 passing through the line D-D in FIG. 1, and substantially perpendicular to the penetrating directions of the through holes 25. Referring to one of the through holes 25 in FIG. 4, the second conductor B of about 2 turns constituting the first winding portion P1 and the second conductor B of about 2 turns constituting the third winding portion P3 sandwich the parallel lines of about 3 turns constituting the second winding portion P2. Thus, the second conductor B constituting the second coil sandwiches the first conductor A and third conductor C constituting the first coil. In the parallel lines constituting the second winding portion P2, the first conductor A and third conductor C, constituting the first coil, sandwich the second conductor B constituting the second coil. That is, the structure illustrated in FIG. 4 is the one in which the first coil and second coil sandwich each other. Thus, the coupling between the first coil and second coil is enhanced, and in particular, the insertion loss in a high frequency range is reduced.

FIG. 5 is a schematic diagram that illustrates an example relation of an insertion loss (dB) to a frequency (MHz) in the balun in the first embodiment. In FIG. 5, the reference example 1 indicates the insertion loss of a balun with the same winding configuration as in the first embodiment, except for three twisted wires used in place of the parallel lines, and the reference example 2 indicates the insertion loss of a balun in which the first conductor A and second conductor B in the first embodiment are exchanged. In the first embodiment in FIG. 5, in particular, the insertion loss in a high-frequency range is reduced. In the first embodiment, the insertion loss in the high-frequency range is more reduced, than that in the reference example 1, which uses the twisted wires, which are generally considered to have strong coupling between the conductors.

Figure 6A:
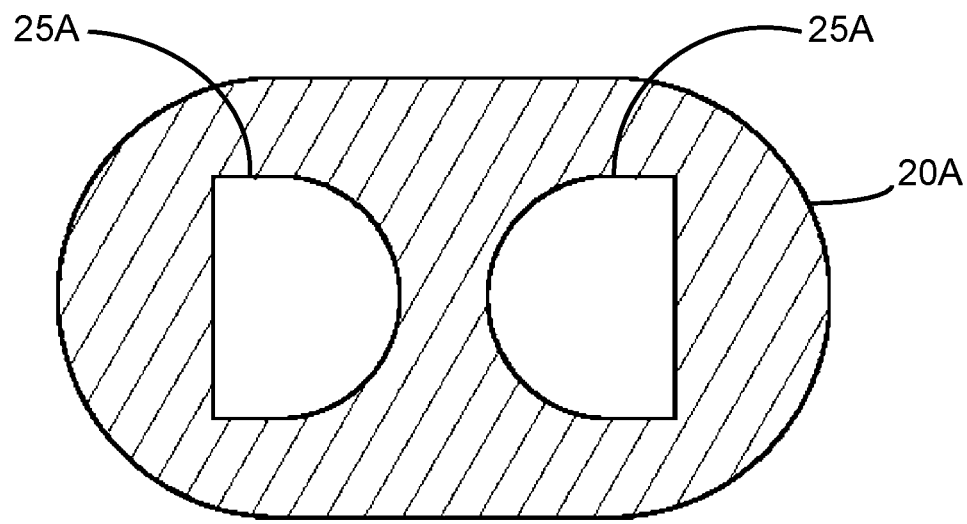
FIG. 6A is a cross-sectional view that illustrates an example of a core.
Figure 6B:
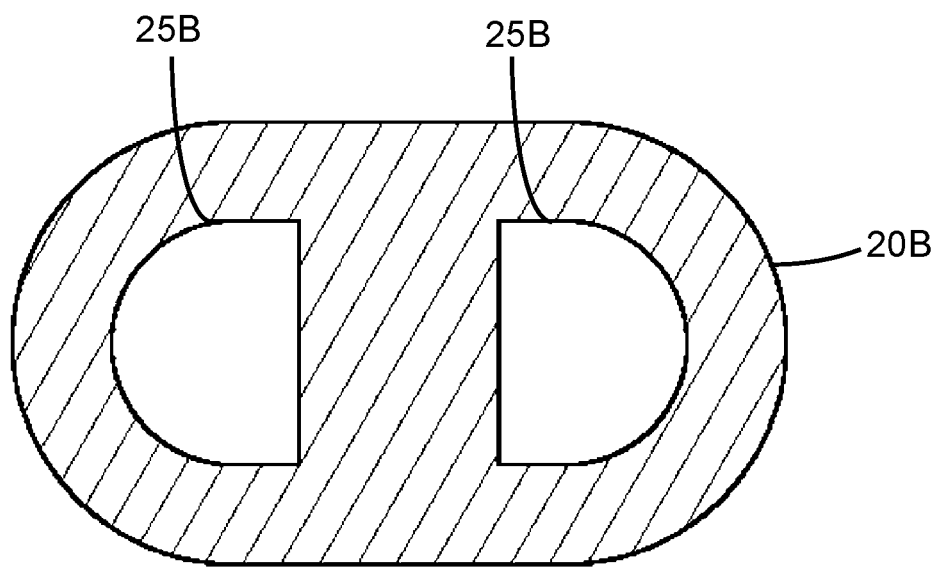
FIG. 6B is a cross-sectional view that illustrates another example of the core.
Figure 6C:
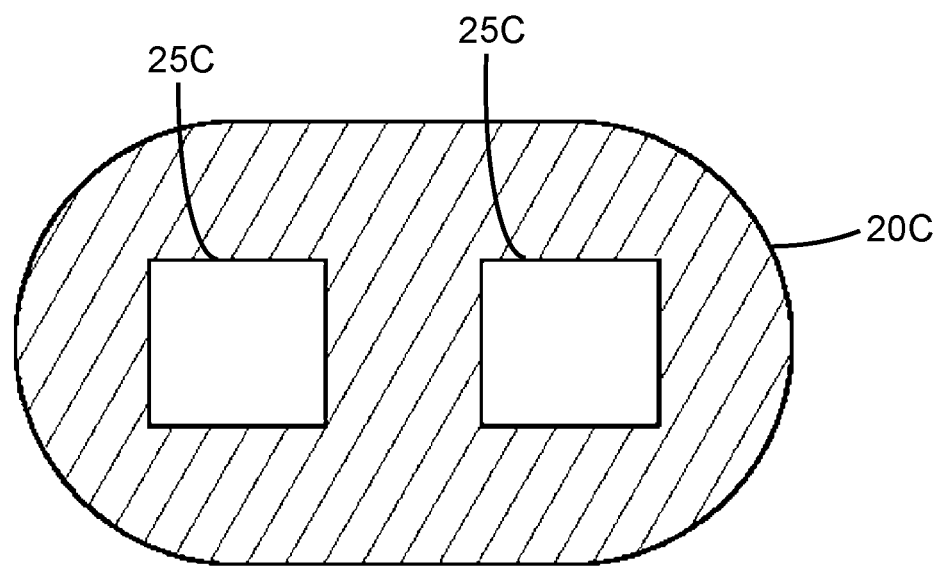
FIG. 6C is a cross-sectional view that illustrates still another example of the core.

In the balun 100 in the first embodiment, the shape of the through hole 25 in a cross section substantially perpendicular to the penetrating direction of the through hole 25 in the core 20 is approximately circular. The cross-sectional shape of the through hole 25 is not limited to being circular. Other examples of the cross-sectional shape may include an oval shape, a shape having an arc area and a linear area, and a polygonal shape formed from linear areas. Specific examples can be illustrated in schematic cross-sectional views of the core in FIGS. 6A to 6C. In the example illustrated in FIG. 6A, the shape of each of the through holes 25A in the core 20A has an arc area and a linear area, and the arc areas of the two through holes 25A face each other with the core 20A disposed therebetween. In the example illustrated in FIG. 6B, the shape of each of the through holes 25B in the core 20B has an arc area and a linear area, and the linear areas of the two through holes 25 arranged in substantially parallel face each other with the core 20B disposed therebetween. In the example illustrated in FIG. 6C, the shape of each of the through holes 25C in the core 20C is a rectangular shape formed from linear areas, and the linear areas of the two through holes 25C arranged in substantially parallel face each other with the core 20C disposed therebetween. In the examples illustrated in FIGS. 6A to 6C, the two through holes 25A, 25B and 25C have substantially the same shapes, and they are substantially symmetric with respect to a plane. However, the two through holes 25, 25A, 25B and 25C may have different shapes and may be asymmetric.

Each of the through holes 25, 25A, 25B and 25C in the balun may have a recess for housing the first winding portion, the recess extending along the penetrating direction. The presence of the recess stabilizes a state in which the conductors are sandwiched. Thus, collapse of winding of the conductors can be suppressed, stable insertion loss characteristics are obtainable, and manufacturing efficiency is enhanced.

Figure 7:
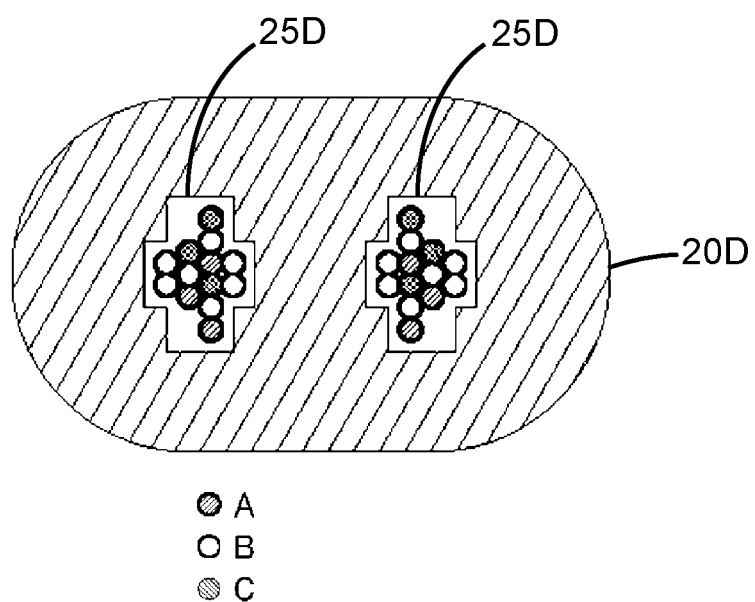
FIG. 7 is a schematic cross-sectional view for describing the winding state of the balun.

FIG. 7 is a schematic cross-sectional view of a core 20D having through holes 25D with recesses. Each of the through holes 25D in FIG. 7 has a polygonal shape formed of linear areas in cross section. In the cross section of the through hole 25D in FIG. 7, the through hole 25D has a substantially rectangular cross section has recesses for housing the first winding portion and the third winding portion, respectively. The recesses are positioned in a surface in the portion between the rectangular through holes 25D and in another surface opposed thereto and extend along the penetrating direction. The sizes of the recesses are selected in accordance with the numbers of turns in the first winding portion and third winding portion and the like. In FIG. 7, the portion in which the second winding portion is disposed has a size that allows two parallel lines to be aligned along the height direction substantially perpendicular to the surface on which the core is placed.

In FIG. 7, the through hole 25D has the recess for housing the third winding portion. The through hole may not have the recess for housing the third winding portion. The through hole 25D having the recesses may have a cross-sectional shape having an arc area. One example is the one in which the through hole having an approximately circular shape has a recess for housing the first winding portion. The cross-sectional shape of the recess is not limited to being rectangular and may be a shape having an arc area.

In the balun in the first embodiment, the conductors are connected directly to the terminals. As described in Japanese Unexamined Patent Application Publication No. 2014-203989, the balun may include binding sections electrically coupled to terminals, and the binding sections may be connected to the conductors.

Second Embodiment

A balun in a second embodiment is the one in which the numbers of turns of the conductors in the balun in the first embodiment are changed. The core and through holes in the second embodiment can have any of the configurations discussed herein. In the balun in the second embodiment, the second conductor B sandwiched between the first conductor A and third conductor C in the parallel lines is separated from the parallel lines, it is wound about 1.5 turns between the two through holes in the core, and this forms the first winding portion. Subsequently, the parallel lines, in which the first conductor A, second conductor B, and third conductor C are integrated, are wound about 2 turns on the first winding portion, and this forms the second winding portion. At this time, the parallel lines are wound such that the planar sections are opposed to the first winding portion. That is, the second winding portion is formed of the parallel lines covering the first winding portion with the planar sections. Subsequently, the second conductor B is separated from the parallel lines, it is wound about 2.5 turns on the second winding portion, and this forms the third winding portion.

In the balun in the second embodiment, the ratio between the number of turns of the first coil and that of the second coil (first coil:second coil) is about 4:6. Accordingly, in the balun in the second embodiment, the impedance ratio between the first coil with the center tap and the second coil is approximately 1:2.

In the balun in the second embodiment, as in the above embodiment, the second conductor B of about 1.5 turns constituting the first winding portion and the second conductor B of about 2.5 turns constituting the third winding portion sandwich the parallel lines of about 2 turns constituting the second winding portion. Thus, the second conductor B constituting the second coil sandwiches the first conductor A and third conductor C constituting the first coil. In the parallel lines constituting the second winding portion, the first conductor A and third conductor C constituting the first coil sandwich the second conductor B constituting the second coil. That is, the balun in the second embodiment has a structure in which the first coil and second coil sandwich each other. Thus, the coupling between the first coil and second coil is enhanced, and in particular, the insertion loss in a high frequency range is reduced.

Third Embodiment

A balun in a third embodiment is the one in which the number of turns of the conductor in the balun in the first embodiment is changed. The core and through holes in the third embodiment can have any of the configurations discussed herein. In the balun in the third embodiment, the second conductor B sandwiched between the first conductor A and third conductor C in the parallel lines is separated from the parallel lines, it is wound about 1.5 turns between the two through holes in the core, and this forms the first winding portion. Subsequently, the parallel lines, in which the first conductor A, second conductor B, and third conductor C are integrated, are wound about 2 turns on the first winding portion, and this forms the second winding portion. At this time, the parallel lines are wound such that the planar sections are opposed to the first winding portion. That is, the second winding portion is formed of the parallel lines covering the first winding portion with the planar sections. Subsequently, the second conductor B is separated from the parallel lines, it is wound about 1.5 turns on the second winding portion, and this forms the third winding portion.

In the balun in the third embodiment, the ratio between the number of turns of the first coil and that of the second coil (first coil:second coil) is about 4:5. Accordingly, in the balun in the third embodiment, the impedance ratio between the first coil with the center tap and the second coil is approximately 2:3.

In the balun in the third embodiment, as in the above embodiments, the second conductor B of about 1.5 turns constituting the first winding portion and the second conductor B of about 1.5 turns constituting the third winding portion sandwich the parallel lines of about 2 turns constituting the second winding portion. Thus, the second conductor B constituting the second coil sandwiches the first conductor A and third conductor C constituting the first coil. In the parallel lines constituting the second winding portion, the first conductor A and third conductor C constituting the first coil sandwich the second conductor B constituting the second coil. That is, the balun in the third embodiment has a structure in which the first coil and second coil sandwich each other. Thus, the coupling between the first coil and second coil is enhanced, and in particular, the insertion loss in a high frequency range is reduced.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A balance-to-unbalance transformer comprising:
   a core having a plurality of through holes; and
   a plurality of conductors wound around a portion of the core between two of the through holes in the core and constituting a first coil and a second coil,
   wherein
   the plurality of conductors include a first conductor, a second conductor and a third conductor, with a portion of the first conductor, a portion of the second conductor and a portion of the third conductor being in a wound arrangement with respect to each other about the portion of the core to form parallel lines and being integrated to include planar sections,
   the first coil and the second coil include a continuous portion of a first winding portion, a second winding portion, and a third winding portion, the first winding portion is formed by another portion of the second conductor that is wound about the portion of the core, the second winding portion is formed by the portions of the first, second and third conductors in the wound arrangement to form the parallel lines such that the planar sections cover the first winding portion, and the third winding portion is formed of an additional portion of the second conductor that is wound about the portion of the core over the second winding portion,
   the first coil includes a center tap connected to one end of the first conductor and to one end of the third conductor,
   another end of the first conductor and another end of the third conductor are opposite ends of the first coil, and
   opposite ends of the second conductor are opposite ends of the second coil.

2. The balun according to claim 1, wherein
   each of the two through holes in the core has an arc area in a cross section substantially perpendicular to its penetrating direction into the core, and
   the two through holes are arranged such that their arc areas face each other with the portion of the core disposed therebetween.

3. The balun according to claim 2, wherein each of the two through holes in the core has a recess configured to house the first winding portion.

4. The balun according to claim 3, wherein
   the second winding portion is formed of the parallel lines passing through at least one of the two through holes at least twice, and at least two planar sections in the parallel lines are arranged in substantially the same plane.

5. The balun according to claim 2, wherein
   the second winding portion is formed of the parallel lines passing through at least one of the two through holes at least twice, and at least two planar sections in the parallel lines are arranged in substantially the same plane.

6. The balun according to claim 2, further comprising:
   a base on which the core is placed, wherein the base includes
   a first terminal group including at least three first terminals, with two of the first terminals being respectively connected to the opposite ends of the first coil and an other of the first terminals being connected to the center tap of the first coil, respectively, and a second terminal group including at least two second terminals respectively connected to the opposite ends of the second coil.

7. The balun according to claim 6, wherein the first terminal group and the second terminal group are arranged on opposed side surfaces of the base.

8. The balun according to claim 1, wherein
each of the two through holes in the core has a linear area in a cross section substantially perpendicular to its penetrating direction into the core, and
the two through holes are arranged such that their linear areas arranged in substantially parallel face each other with the portion of the core disposed therebetween.

9. The balun according to claim 8, wherein each of the two through holes in the core has a recess configured to house the first winding portion.

10. The balun according to claim 9, wherein
the second winding portion is formed of the parallel lines passing through at least one of the two through holes at least twice, and at least two planar sections in the parallel lines are arranged in substantially the same plane.

11. The balun according to claim 8, wherein
the second winding portion is formed of the parallel lines passing through at least one of the two through holes at least twice, and at least two planar sections in the parallel lines are arranged in substantially the same plane.

12. The balun according to claim 8, further comprising:
a base on which the core is placed, wherein the base includes
a first terminal group including at least three first terminals, with two of the first terminals being respectively connected to the opposite ends of the first coil and an other of the first terminals being connected to the center tap of the first coil, respectively, and
a second terminal group including at least two second terminals respectively connected to the opposite ends of the second coil.

13. The balun according to claim 1, wherein each of the two through holes in the core has a recess configured to house the first winding portion.

14. The balun according to claim 13, wherein
the second winding portion is formed of the parallel lines passing through at least one of the two through holes at least twice, and at least two planar sections in the parallel lines are arranged in substantially the same plane.

15. The balun according to claim 13, further comprising:
a base on which the core is placed, wherein the base includes
a first terminal group including at least three first terminals, with two of the first terminals being respectively connected to the opposite ends of the first coil and an other of the first terminals being connected to the center tap of the first coil, respectively, and
a second terminal group including at least two second terminals respectively connected to the opposite ends of the second coil.

16. The balun according to claim 1, wherein
the second winding portion is formed of the parallel lines passing through at least one of the two through holes at least twice, and at least two planar sections in the parallel lines are arranged in substantially the same plane.

17. The balun according to claim 16, further comprising:
a base on which the core is placed, wherein the base includes
a first terminal group including at least three first terminals, with two of the first terminals being respectively connected to the opposite ends of the first coil and an other of the first terminals being connected to the center tap of the first coil, respectively, and
a second terminal group including at least two second terminals respectively connected to the opposite ends of the second coil.

18. The balun according to claim 1, further comprising:
a base on which the core is placed, wherein the base includes
a first terminal group including at least three first terminals, with two of the first terminals being respectively connected to the opposite ends of the first coil and an other of the first terminals being connected to the center tap of the first coil, respectively, and
a second terminal group including at least two second terminals respectively connected to the opposite ends of the second coil.

19. The balun according to claim 18, wherein the first terminal group and the second terminal group are arranged on opposed side surfaces of the base.

* * * * *